United States Patent
Chung et al.

(10) Patent No.: US 6,872,114 B2
(45) Date of Patent: Mar. 29, 2005

(54) METHOD OF SEALING ORGANO ELECTRO-LUMINESCENT DISPLAY

(75) Inventors: Chia-Tin Chung, Toufen Jen, Miaoli (TW); Hao Jung Huang, Yuan-lin Chen Changhua Hsin (TW); Chen Wei Huang, Tainan (TW)

(73) Assignees: Chi Mei Optolectronics Corporation (TW); Kyocera Corporation, Kyoto (JP)

( * ) Notice: Subject to any disclaimer, the term of this patent is extended or adjusted under 35 U.S.C. 154(b) by 0 days.

(21) Appl. No.: 10/760,862

(22) Filed: Jan. 20, 2004

(65) Prior Publication Data

US 2004/0152390 A1 Aug. 5, 2004

Related U.S. Application Data

(62) Division of application No. 09/995,447, filed on Nov. 27, 2001.

(30) Foreign Application Priority Data

Oct. 17, 2001 (TW) ........................................ 90125665 A

(51) Int. Cl.⁷ ................................................ H01J 9/00
(52) U.S. Cl. ........................................................ 445/24
(58) Field of Search ............................. 445/24, 25, 50, 445/51; 313/504–506

(56) References Cited

U.S. PATENT DOCUMENTS

| | | | |
|---|---|---|---|
| 6,465,953 B1 * | 10/2002 | Duggal |
| 6,570,325 B2 * | 5/2003 | Graff et al. |
| 6,573,652 B1 * | 6/2003 | Graff et al. |
| 2002/0125822 A1 * | 9/2002 | Graff et al. |

* cited by examiner

Primary Examiner—Joseph Williams
(74) Attorney, Agent, or Firm—Merchant & Gould P.C.

(57) ABSTRACT

A top-emission organic electro-luminescent display (OLED) has a substrate with at least a anode layer, an organic fluorescent film, at least a cathode layer, a barrier layer and a protection layer. A transparent sealing structure is glued to the top of the substrate. Wherein, the transparent sealing structure has an adhesion layer glued to the protection layer, a plurality of organic resin layers formed on the adhesion layer, a plurality of inorganic barrier layers disposed between the organic resin layers, a flexible polymer film formed on the organic resin layer, and a hard coat formed on the flexible polymer film.

6 Claims, 2 Drawing Sheets

METHOD OF SEALING ORGANO ELECTRO-LUMINESCENT DISPLAY

This application is a divisional of application Ser. No. 09/995,447, filed Nov. 27, 2001, pending, which application(s) are incorporated herein by reference.

BACKGROUND OF THE INVENTION

1. Field of the Invention

The present invention relates to an organic electro-luminescent display (OLED) and a method of forming the same and, more particularly, to a top-emission OLED and a method of sealing the same.

2. Description of the Related Art

In the new generation of flat panel techniques, organic electro-luminescent display (OLED) has advantages of self-luminescence, wide-view angle, thin profile, lightweight, low driving voltage and simple process. In OLEDs with a laminated structure, organic compounds such as dyes, polymers, or other luminescent materials serve as an organic luminescent layer and are disposed between cathode and anode. In accordance with the driving mode, OLED is classified into passive matrix and active matrix types. Alternatively, in accordance with the luminescent path, OLED is classified into a bottom-emission OLED and a top-emission OLED. Conventionally, both of the passive and active matrix types are fabricated as the bottom-emission OLED in which glass material is used to form the luminescent faceplate and transparent conductive material is used to form the anode layer. Thus, when electrons and holes are combined as excitons in the organic luminescent layer, light radiates from the transparent faceplate. However, since the luminescent regions of the R, G and B are different within each pixel area, TFT structures in array have different sizes and thus reduce the aperture ratio of the bottom-emission OLED.

In order to increase the aperture ratio, a top-emission OLED is developed in which the cathode layer is transparent materials and a transparent faceplate is sealed on the top of the OLED. FIG. 1 is a sectional diagram showing a conventional top-emission OLED. The top-emission OLED 10 has TFT devices and circuit devices completed in the substrate 10. On the substrate 10, a lengthwise-extending anode layer 12, an organic electron-hole transmitting layer 13, an organic fluorescent film 14, an organic electron transport layer 15, a transversely-extending cathode layer 16, a barrier layer 17 and a transparent faceplate 18 are successively formed. When avoltage is applied to the top-emission OLED, electrons and holes are relatively removed to the organic fluorescent film 14 to radiate light from the transparent faceplate 18. The direction of radiation is shown as the arrow. Therefore, the size of the TFT device does not affect the luminescent faceplate 18, and the materials of the substrate 10 can be selected from glass, silicon, ceramic materials, or plastic materials.

However, as the duration of use increases, the probability of moisture and oxygen permeating the OLED also increases, causing detachment between the organic luminescent layer 14 and the cathode electrode 16, cracking of the organic materials, and oxidation of the electrodes. As a result, a so-called "dark spot", to which electricity is not supplied, is generated, decreasing luminescence and luminescent uniformity. Accordingly, in conventionally sealing the top of the top-emission OLED, one method uses a glass plate to isolate moisture/oxygen from the outer environment, but the glass plate with large volume and weight does not fit the requirements of the OLED. The other method coats a UV-curing resin on the top of the top-emission OLED to provide a transparent result, but the resin with outgassing phenomenon and poor resistance to moisture cannot assure the luminescent property of the OLED. Thus, a novel sealing structure of the top-emission OLED solving the aforementioned problems is called for.

SUMMARY OF THE INVENTION

The present invention provides a top-emission OLED and a method of sealing the same to increase aperture ratio and resistance to moisture.

The top-emission organic electro-luminescent display (OLED) has a substrate with at least a lengthwise-extending anode layer, an organic fluorescent film, at least a transversely-extending cathode layer, a barrier layer and a protection layer. A transparent sealing structure is glued to the top of the substrate. The transparent sealing structure has an adhesion layer glued to the protection layer, a plurality of organic resin layers formed on the adhesion layer, a plurality of inorganic barrier layers disposed between the organic resin layers, a flexible polymer film formed on the organic resin layer, and a hard coat formed on the flexible polymer film.

Accordingly, it is a principle object of the invention to provide the inorganic barrier layer to achieve a good resistance to moisture/oxygen.

It is another object of the invention to provide the organic resin layer to decrease the internal stress generated by the organic barrier layer and assure the planarization of the sealing structure.

Yet another object of the invention is to provide the hard coat to obstruct the permeation/pollution of moisture, oxygen and impurities.

It is a further object of the invention to provide the sealing structure to achieve good planarization, excellent resistance to moisture and sufficient transparency.

Still another object of the invention is to provide the sealing structure to promote the luminescent property and lifetime of the top-emission OLED.

Another object of the invention is to provide the sealing structure to achieve commercial requirements of the top-emission OLED, such as light weight and thin type.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides a sealing structure of a top-emission OLED and a method of sealing the same, in which the top-emission OLED is applied to a passive matrix type or an active matrix type. In sealing the top-emission OLED, the sealing structure formed as laminated film is glued to the top of the top-emission OLED. This method is simple and the sealing structure provides a favorable aperture ratio and excellent resistance to moisture/oxygen.

Figure 1:
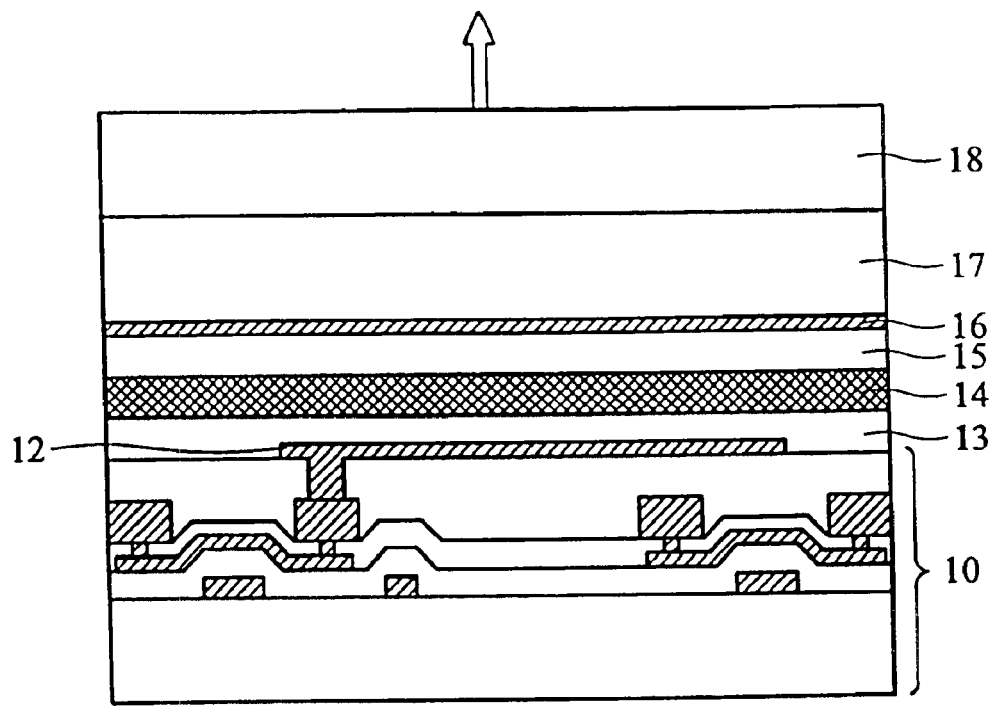
FIG. 1 is a sectional diagram showing a conventional top-emission OLED.
Figure 2:
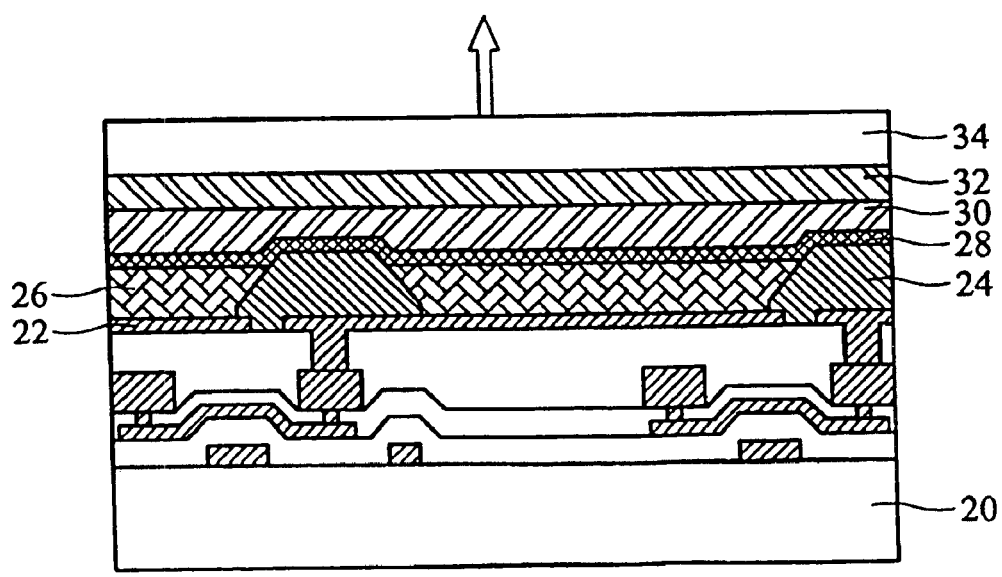
FIG. 2 is a sectional diagram showing a top-emission OLED according to the present invention.

FIG. 2 is a sectional diagram showing a top-emission OLED according to the present invention. The top-emission OLED has a plurality of TFT devices in array and circuit structures completed in a substrate 20. Also, according to the designed pattern of the pixel area, a plurality of lengthwise-extending anode layers 22, an organic fluorescent film 24, a plurality of ribs 24 for separating adjacent luminescent spaces, a plurality of transversely-extending cathode layers 28, a transparent barrier layer 30, a transparent protection layer 32 and a transparent sealing structure 34 are successively formed on the substrate 20.

The anode layer 22 and cathode layer 28 are formed using conductive materials with low resistance and low work function, wherein the work function is the required energy (eV) for driving charges. Also, since the cathode layer 28 needs to be transparent, transparent conductive materials are preferred for the use of the cathode layer 28. The transparent barrier layer 30 uses inorganic materials, such as SiO, $SiO_x$, $SiO_2$, and $Si_3N_4$, those are formed by plasma enhanced chemical vapor deposition (PECVD). The transparent protection layer 32 uses organic materials, such as resin by spin-on coating, resulting in a planarized surface.

Figure 3:
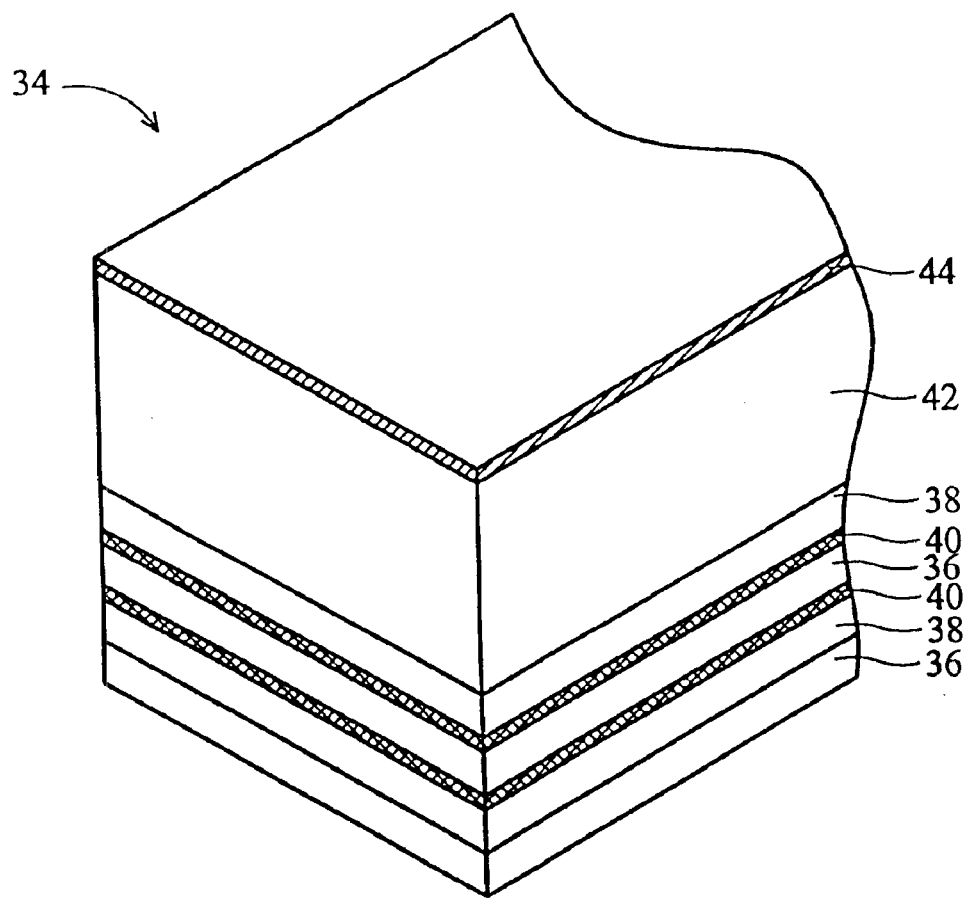
FIG. 3 is a schematic diagram showing the transparent sealing structure according to the present invention.

FIG. 3 is a schematic diagram showing the transparent sealing structure 34 according to the present invention. The transparent sealing structure 34 comprises an adhesion layer 36, a plurality of organic resin layers 38, a plurality of inorganic barrier layers 40 respectively disposed between the organic resin layers 38, a flexible polymer film 42 and a hard coat 44. The adhesion layer 36 is selected from resin or any other transparent adhesion materials to provide adhesion between the sealing structure 34 and the protection layer 32. The inorganic barrier layer 40 is selected from transparent dielectrics, such as SiC, $SiO_2$, $Si_3N_4$, $Al_2O_3$ by PECVD to provide a good resistance to moisture/oxygen. The organic resin layer 38 is used to decrease the internal stress generated by the organic barrier layer 40 to assure the planarization of the sealing structure 34. The hard coat 44 may be a hardened coating, an anti-reflective coating or a ¼□ polarizer, for example, a laminated structure consisting of $SiO_2$, TiN and TiN/$SiO_2$. The hard coat 44 is employed to obstruct the permeation/pollution of moisture, oxygen and impurities. As a whole, the sealing structure 34 provides good planarization, excellent resistance to moisture and sufficient transparency to promote the luminescent property and lifetime of the top-emission OLED. Furthermore, the sealing structure 34 achieves commercial requirements of the top-emission OLED, such as light weight and thin type.

In sealing the top-emission OLED, when the barrier layer 30 and the protection layer 32 are completed on the substrate 20, the adhesion layer 36 is coated at the bottom of the sealing structure 34 or coated on the top of the substrate 20. Then, using a roll-press manner, the sealing structure 34 is glued to the top of the top-emission OLED. This sealing method is simple to reduce process costs and increase throughput of the top-emission OLED.

It is to be understood that the present invention is not limited to the embodiments described above, but encompasses any and all embodiments within the scope of the following claims.

What is claimed is:

1. A method of sealing a top-emission organic electroluminescent display (OLED), comprising steps of:
   providing a substrate which has at least an anode layer, an organic fluorescent film, at least a cathode layer, a barrier layer and a protection layer;
   adhering a transparent sealing structure which has a plurality of organic resin layers formed on a first side of a flexible polymer film, a plurality of inorganic barrier layers disposed between the organic resin layers;
   providing a hard coat formed on a second side of the flexible polymer film; and
   adhering the transparent sealing structure to the protection layer of the substrate by a first transparent adhesion layer after forming the transparent sealing structure.

2. The method according to claim 1, wherein the first transparent adhesion layer is formed at the organic resin layer of the transparent sealing structure.

3. The method according to claim 1, wherein the first transparent adhesion layer is formed on the protection layer of the substrate.

4. The method according to claim 1, wherein the transparent sealing structure is adhered to the protection layer of the substrate by a roll-press manner.

5. The method according to claim 1, wherein the transparent sealing structure comprises forming a second transparent adhesion layer between two of the inorganic barrier layers.

6. The method according to claim 1, wherein providing the hard coat of the sealing structure is selected from one of the group consisting of hardened coating, anti-reflective coating, and ¼ λ polarizer.

* * * * *

UNITED STATES PATENT AND TRADEMARK OFFICE
CERTIFICATE OF CORRECTION

PATENT NO. : 6,872,114 B2
DATED : March 29, 2005
INVENTOR(S) : Chung et al.

It is certified that error appears in the above-identified patent and that said Letters Patent is hereby corrected as shown below:

<u>Title page,</u>
Item [54], Title, "METHOD OF SEALING ORGANO ELECTRO-LUMINESCENT DISPLAY" should read -- METHOD OF SEALING ORGANIC ELECTRO-LUMINESCENT DISPLAY --.

Signed and Sealed this

Twenty-seventh Day of September, 2005

JON W. DUDAS
*Director of the United States Patent and Trademark Office*